United States Patent
Reohr, Jr. et al.

(10) Patent No.: US 6,671,837 B1
(45) Date of Patent: Dec. 30, 2003

(54) DEVICE AND METHOD TO TEST ON-CHIP MEMORY IN A PRODUCTION ENVIRONMENT

(75) Inventors: Richard D. Reohr, Jr., Hillsboro, OR (US); Brian M. Collins, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 253 days.

(21) Appl. No.: 09/588,005

(22) Filed: Jun. 6, 2000

(51) Int. Cl.[7] .......................... G11C 29/00; G11C 7/00
(52) U.S. Cl. ................................. 714/719; 365/201
(58) Field of Search ............................... 714/718, 719; 365/201, 200

(56) References Cited

U.S. PATENT DOCUMENTS

| | | | | |
|---|---|---|---|---|
| 5,222,066 A | * | 6/1993 | Grula et al. ................ | 714/718 |
| 5,287,472 A | * | 2/1994 | Horst .................... | 365/189.08 |
| 6,067,262 A | * | 5/2000 | Irrinki et al. ............... | 365/201 |
| 6,185,709 B1 | * | 2/2001 | Dreibelbis et al. .......... | 714/726 |
| 6,367,042 B1 | * | 4/2002 | Phan et al. .................. | 714/733 |
| 6,404,684 B2 | * | 6/2002 | Arimoto et al. ............ | 365/201 |
| 6,405,331 B1 | * | 6/2002 | Chien ......................... | 714/718 |
| 6,415,403 B1 | * | 7/2002 | Huang et al. ............... | 714/726 |
| 6,504,768 B1 | * | 1/2003 | Roohparvar et al. ........ | 365/200 |

OTHER PUBLICATIONS

Chih–Tsun Huang; Jing–Reng Huang; Chi–Feng Wu; Cheng–Wen Wu; Tsin–Yuan Chang; A programmable BIST core for embedded DRAM; IEEE Design & Test of Computers, vol.: 16 Issue: Jan.–Mar. 1, 1999 pp. 59–70.*

Dekker, R.; Beenker F.; Thijssen, L.; Realistic built–in self–test for static RAMs; IEEE Design & Test of Computers, vol. 6 Issue: Feb. 1, 1989 pp. 26–34.*

Van Wauwe, G.; Huyskens, E.; A cost effective way to test embedded RAM and ROM 1990. Proceedings., Third Annual IEEE, 1990 pp. 914/8.1–P14/8.4.*

Nadeau–Dostie, B.; Silburt, A.; Agarwal, V.K.; Serial Interfacing for embedded–memory testing;IEEE Design & TEst of Computers, vol.: Issue: 2, Apr. 1990 pp. 52–63.* van Sas, J.; Catthoor, F.; Inze, L.; De Man, H.; Testability strategy for register and memories in a multi–processor architecture; Proceedings of the 1st European Test Conference, 1989; pp:294–303.*

Chin TSung Mo; Chung Len Lee; Wen Ching Wu; A self–diagnostic BIST memory design scheme; Records of the IEEE International Workshop on Memory Technology, Design and Testing, 1994; pp. 7–9.*

Castro Alves, V.; Lubaszewski, M.S.; Nicolaidis, M.; Courtois, B.; Testing embedded single and multi–port RAMs using BIST and boundary scan; Design Automation, 1992 Proceedings., [3rd] European Conference on, 1992; pp. 159–163.*

Jin, L.; Testing techniques for embedded memories in ASIC; 2nd International Conference on ASIC, 1996; pp. 376–379*

* cited by examiner

*Primary Examiner*—Albert Decady
*Assistant Examiner*—Joseph D. Torres
(74) *Attorney, Agent, or Firm*—Kenyon & Kenyon

(57) ABSTRACT

A device and method to test memory embedded in a chip in which the memory is not directly accessible from a tester external to the chip. The device and method uses a state machine embedded in control circuitry of the chip to execute software to test the memory embedded on the chip. The software in turn employs a row and column address generator connected to the state machine to access each memory location in the memory embedded in the chip. A data generator is also used by the software to generate and write data to memory locations specified by the row and column address generator. Several multiplexers are used to accept data from the data generator and pass the data to the memory embedded in the chip. These multiplexers act to enable reads and writes to memory when a memory test is performed or to enable normal reads and writes to memory when normal operations of the chip are executed. A data comparator is used to determine if the memory is working properly.

21 Claims, 5 Drawing Sheets

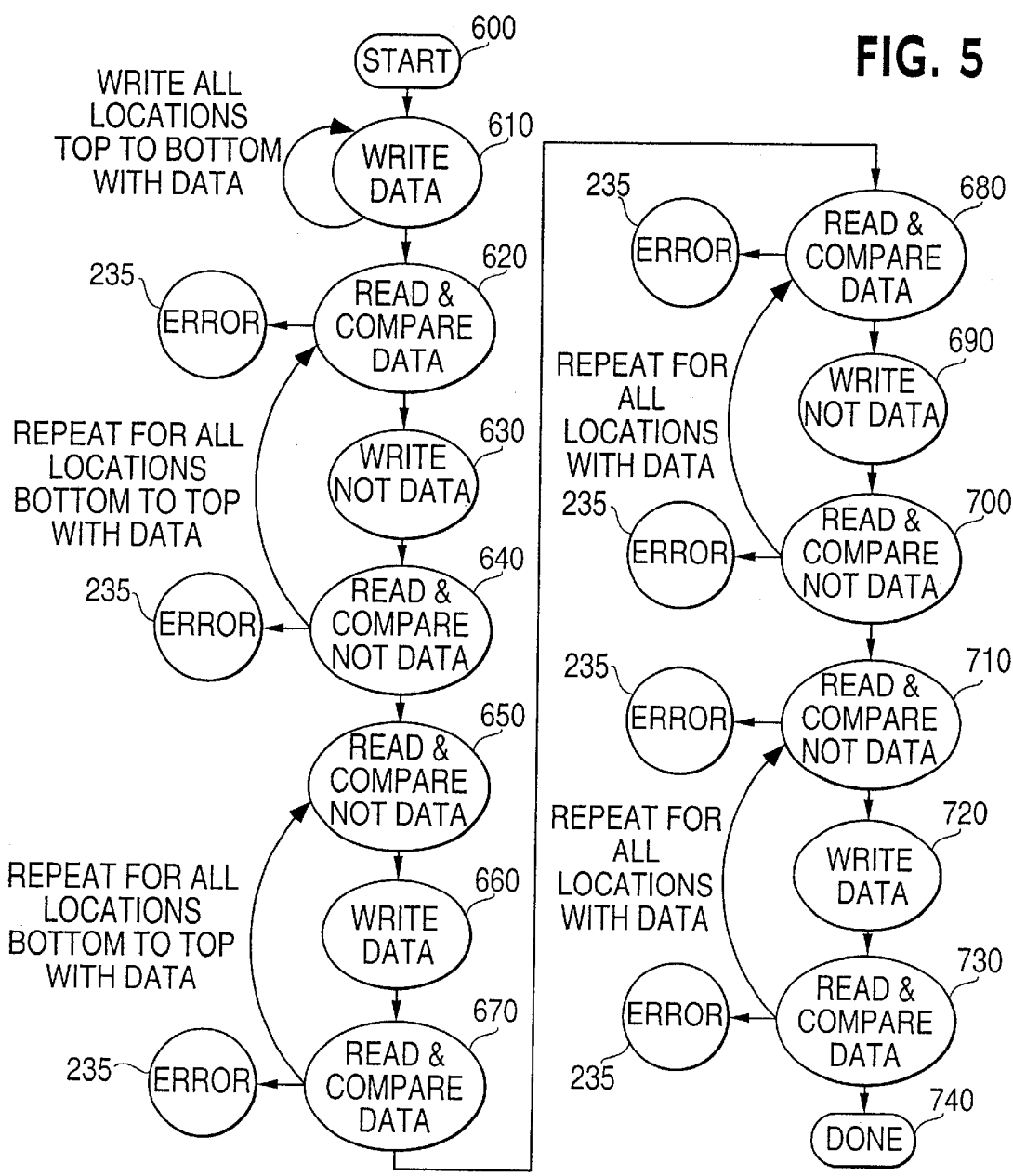

DEVICE AND METHOD TO TEST ON-CHIP MEMORY IN A PRODUCTION ENVIRONMENT

FIELD

The invention generally relates to a device and method to test on-chip memory in a production environment, and more specifically to ensure the proper functionality of static random access memory (SRAM) embedded in a chip in a production and post production environment.

BACKGROUND

Advances in chip manufacturing technology have enabled rapid progress to be seen in the speed, size and cost of computer systems. At one time it would have been considered impossible to put a sizable amount of memory on a single chip. Today not only is it possible to have a large amount of memory on a single chip, it is also possible for the circuitry for a device or a communications controller to be placed on a single chip and also have a significant amount of embedded memory in the form of SRAM on the same chip. In this manner a chip 10, as shown in FIG. 1, would have its own Random Access Memory (RAM) 30 that it may use as temporary storage. This chip 10 may be, for example, a cluster adapter used in a next generation input/output (NGIO) architecture and the RAM 30 may be use to store such information as a routing table that identifies the shortest path to any node in the network or as temporary storage of data being transferred from one port to another. The RAM 30 would be accessed by the chip 10 control circuitry 20 via input 60 and output 70. Chip 10 would in turn interface to other system components through input port 40 and output port 50.

By using a RAM 30 located on the same chip 10 as the control circuitry 20, it is possible to achieve an enormous performance increase over accessing a computer's main memory to store needed tables and act as a temporary storage. This performance improvement can even be seen when memory used by a controller is on one chip and the controller is on another.

However, a significant problem arises in the manufacturing of a chip 10 that has both control circuitry 20 used for communications in a network or to perform some other function as well as having embedded RAM 30. This problem is that there is no way to directly access RAM 30 from outside the chip 10 in order to test if all bits in the RAM 30 are functioning properly at full operating speed of the chip. In a chip that has only memory on it, each and every bit may be directly accessed through the pins on the chip from a tester. In the case of the chip 10, shown in FIG. 1, no direct access method is provided to RAM 30 from outside chip 10 through input pins 40 and the reading of memory through output pins 50. Any memory access to RAM 30 is through control circuitry 20 via memory input channels 60 and memory output channel 70. However, the control circuitry 20 is not designed to test RAM 30 but to use RAM 30 to perform some other function, such as communications. This control circuitry 20 was never designed to perform memory tests.

This problem can be extremely significant to a manufacturer that warranties its products against defects. A single bit that is not functioning properly can cause severe problems which would be difficult to diagnose in a computer system. Therefore, until the creation of the present invention, only functional tests of the chip 10 were possible. None of these tests could identify a problem related to the RAM 30, let alone a problem with individual bits in the RAM 30. Further, testing memory requires checking for data retention faults to determine if a bit will hold its value over time, stuck-at faults to determine if a bit can have its value changed, and metal bridging faults in which resistive shorts between metal lines on the same layer causing a cell to read back the wrong data. In addition, further memory must be performed to check for coupling faults in which two adjacent cells or bit have the same value, address faults related to accessing memory locations, and read disturbance faults in which the value of a bit changes when it is read.

Therefore, what is needed is a device and method in which memory embedded in a chip whose primary function is not memory access may be completely tested. This device and method must have as little impact on the hardware design of the chip as possible so as not to interfere with the normal operation of the chip and to take up minimal space on the chip. This device and method should also not require a significant number of additional pins on the chip and not require additional pins to enable direct memory access to the chip.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 5 is a flowchart of the operations performed by the BIST inner loop module shown in FIG. 3.

DETAILED DESCRIPTION

Figure 1:
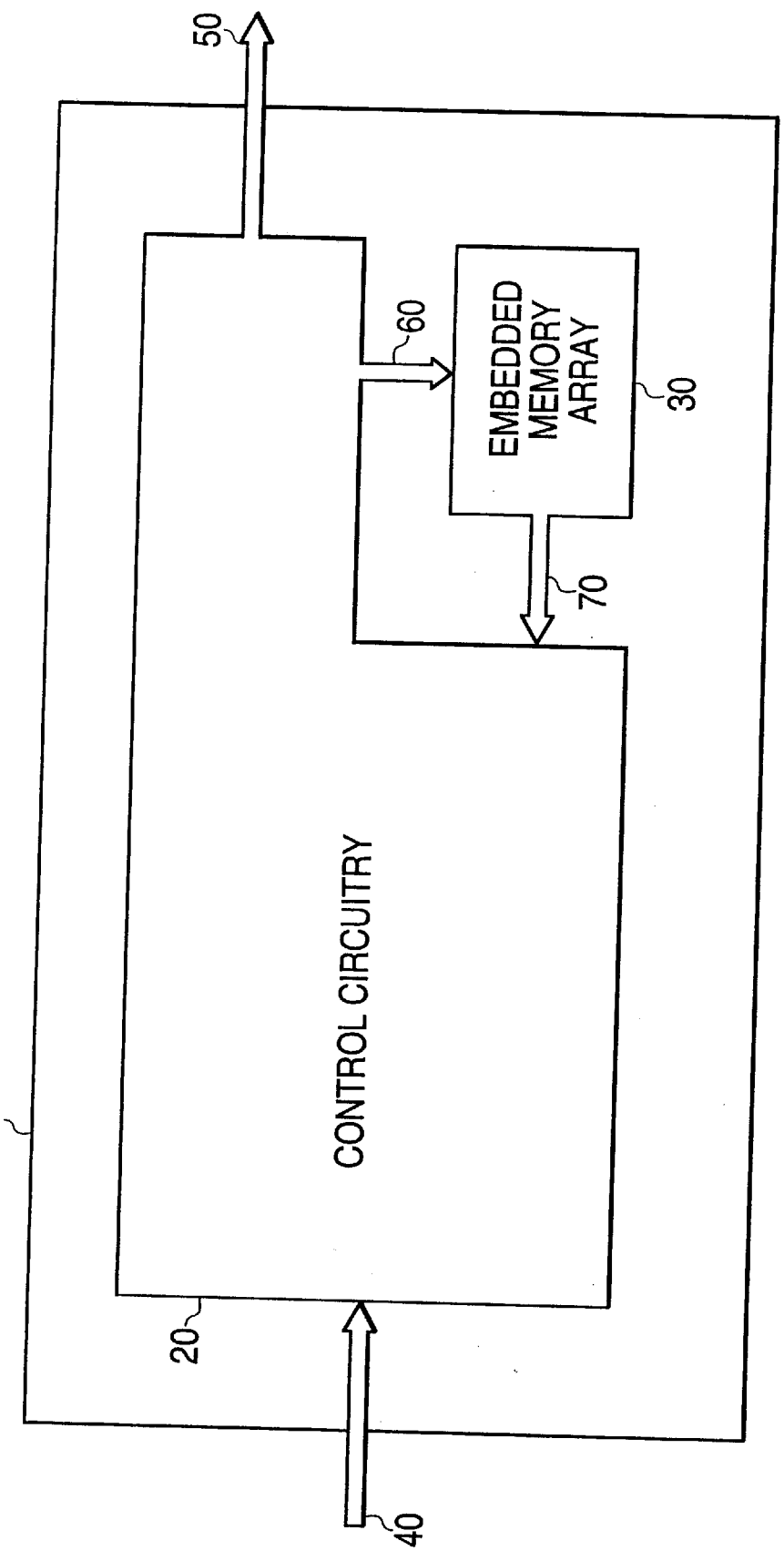
FIG. 1 is an example of a chip having control circuitry and embedded memory.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known power connections to integrated circuits and other components may not be shown within the FIGs. for simplicity of illustration and discussion, and so as not to obscure the invention.

The present invention is a device to test memory embedded in a chip. The device includes a state machine embedded in control circuitry of the chip to execute software to test the memory embedded on the chip. This memory is not directly accessible from outside the chip. A row and column address generator connected to the state machine is used to access each memory location in the memory embedded in the chip. A data generator is used to generate and write data to memory locations specified by the row and column address generator in the memory embedded in the chip. Several multiplexers are used to accept data from the data generator and pass the data to the memory embedded in the chip. A data comparator is connected to the state machine to compare the data received from the data generator and the data received from the memory embedded on the chip, wherein when a match is not detected by the data comparator, the data comparator signals the state machine and the state machine sets an error signal high indicating a memory failure.

Figure 2:
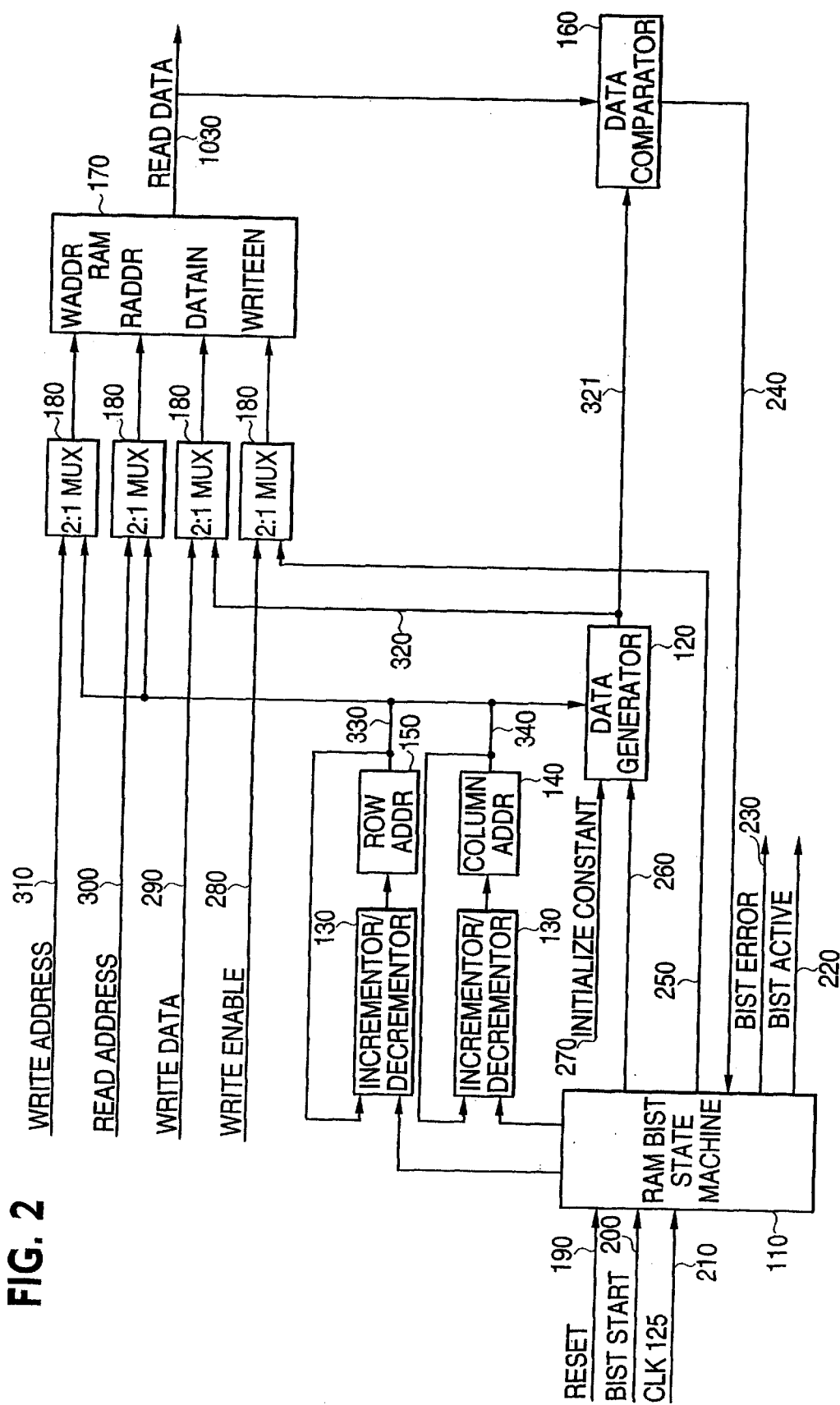
FIG. 2 is an example of an overall system diagram of an embodiment of the present invention.
Figure 3:
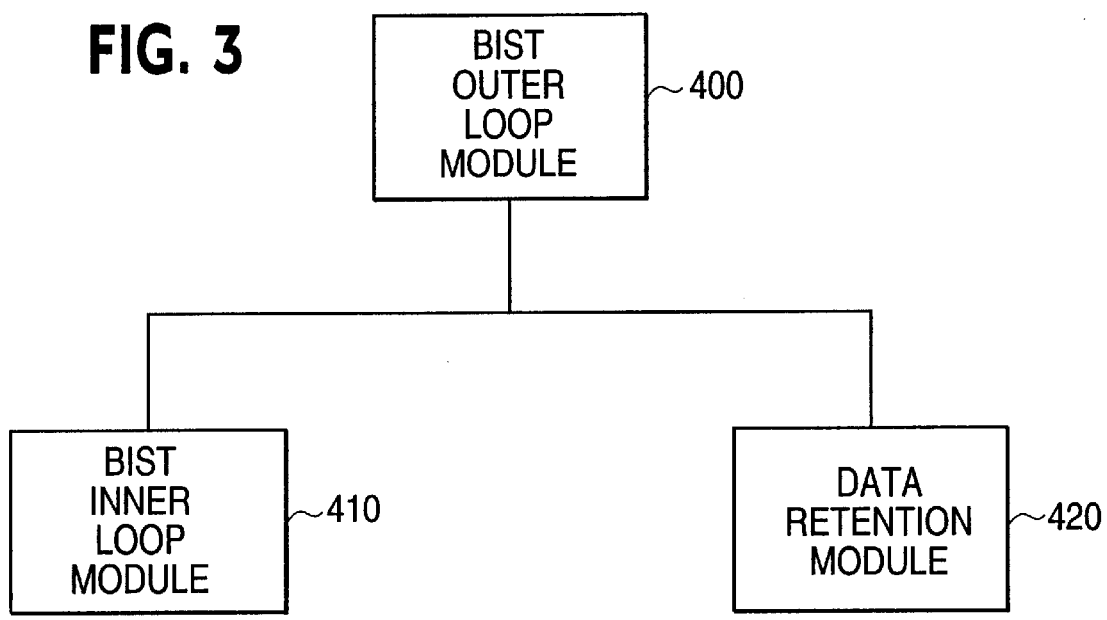
FIG. 3 is an example module configuration diagram of an embodiment of the present invention.

FIG. 2 is an example of an overall system diagram of an embodiment of the present invention. The components shown in FIG. 2 are contained within control circuitry 20 shown in FIG. 1 with the exception of RAM 30. Two additional signals are provided to interface to the random access memory (RAM) Built In Self Test (BIST) state machine 110 from outside chip 10. These signals are a reset signal 190 and a BIST start signal 200, also referred to as a start signal, which are used to control the RAM BIST state machine 110. The BIST start signal 200 when set high activates the BIST outer loop module 400 shown in FIG. 3 and FIG. 4. The reset signal 190 is used to reset the RAM BIST state machine 110. A clock signal 210 is also provided to synchronize the activities of the RAM BIST state machine 110 with the remainder of the chip 10. The RAM BIST state machine 110, as referred to as the state machine, is used exclusively to test RAM 30 utilizing the software modules shown in FIGS. 3 through 5. Whenever either the BIST outer loop module 400, the BIST inner loop module 410 or the data retention module 420, as shown and FIG. 3, are executing, the BIST active signal 220 is set high. If either the BIST outer loop module 400, the BIST inner loop module 410 or the data retention module 420 detect an error in RAM 30, a BIST error signal 230 is set high. In this manner, each and every memory location in RAM 30 may be addressed and tested as will be described in further detail ahead.

Memory locations in RAM 30 are addressed using a plurality of incrementors/decrementors 130 in conjunction with column address generator 140 and row address generator 150. Memory cells of RAM 30 are laid out and accessed in a two-dimensional array which is addressed by row and column addresses. The incrementor/decrementor 130 is used to increment or decrement the row and column address in order to access each memory cell in RAM 30. In this manner the RAM BIST state machine 110 is able to access each memory location in RAM 30 through the use of the incrementor/decrementor 130 in conjunction with row address generator 150 and column address generator 140.

In order to test RAM 30 a data generator 120 is provided connected to the RAM BIST state machine 110 through line 260. Initialize constant 270 signal is used to initialize data generator 120. The RAM BIST state machine 110 may specify any bit pattern desired. Typically, a hexadecimal value of AA (binary "10101010") or hexadecimal value of 55 (binary "01010101") is used to test a byte of memory. Upon receipt of the row address from row address generator 150 through line 330 and column address from column address generator 140 through line 340 as well as the bit pattern through line 260 from the RAM BIST state machine 110, the data generator will write the bit pattern via line 320 to one of a plurality of multiplexers 180. Further, RAM BIST state machine 110 will set line 250 to high for all multiplexers 180. With line 250 set high all multiplexers 180 will accept data only from the RAM BIST state machine 110. The write address 310 signal, read address 300 signal, write data 290 signal, and write enable 280 signal will not be transferred to RAM 30 via multiplexers 180 as would otherwise normally occur. Thus, during the testing of RAM 30, normal read and write operations by control circuitry 20 to RAM 30 will not be allowed.

Simultaneously with writing the bit pattern to RAM 30, the bit pattern also is written to the data comparator 160 through line 321. Further, as the bit pattern is read from RAM 30, on read data line 1030, it is also written to data comparator 160. The results of the comparison made by data comparator 160 are sent back to RAM BIST state machine 110 along line 240. If the values match between those sent to data comparator 160 from data generator 120 and RAM 30, then RAM BIST state machine 110 will keep BIST error signal 230 set to low. However, if the values of the bit pattern do not match, then RAM BIST state machine 110 will set the error signal 230 to high.

Figure 4:
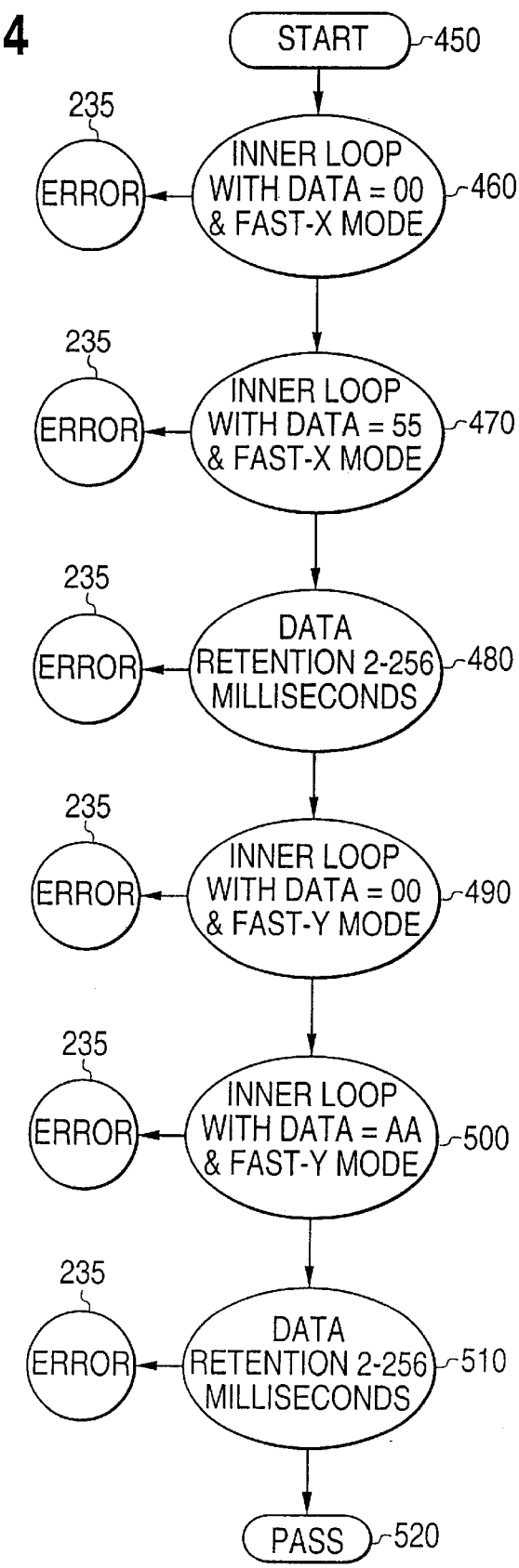
FIG. 4 is a flowchart of the operations performed by the Built In Self Test (BIST) outer loop module shown in FIG. 3.

Once all tests involving the software shown on FIGS. 3 through 5 have completed BIST active signal 220 and line 250 are set to low or zero. At this point write enable 280 signal, write data 290 signal, read address 300 signal, and write address 310 signal are enabled through the plurality of multiplexers 180 for normal operation.

Utilizing the hardware shown in FIG. 2, it is possible to test every memory location in RAM 30 while having a minimal impact on the design of chip 10. The elements related to testing normally are used in a production or post production facility only. Once tested, chip 10 would operate in a normal manner to perform the function it was specifically designed for with multiplexers 180 accepting and relaying data from the write address 310 signal, read address 300 signal, write data 290 signal, and write enable 280 signal.

Before proceeding into a detailed discussion of the logic used by the present invention it should be mentioned that the flowcharts shown in FIGS. 4 and 5 as well as the modular configuration diagram shown in FIG. 3 contain software, firmware, hardware, processes or operations that correspond, for example, to code, sections of code, instructions, commands, objects, hardware or the like, of a computer program that is embodied, for example, on a storage medium such as floppy disk, CD-Rom (Compact Disc read-only Memory), EP-Rom (Erasable Programmable read-only Memory), RAM (Random Access Memory), hard disk, etc. Further, the computer program can be written in any language such as, but not limited to, for example C++. In the discussion of the flowcharts in FIGS. 4 and 5, reference will be simultaneously made to the corresponding software modules shown in FIG. 3.

FIG. 3 is an example module configuration diagram of an embodiment of the present invention executing software on the RAM BIST state machine 110. A BIST outer group module 400 is used to control the overall test of RAM 30 using a BIST inner loop module 410 and a data retention module 420.

Referring to FIG. 4, the BIST outer loop module 400 begins execution in operation 450 and immediately proceeds to operation 460. In operation 460, the BIST outer loop module 400 sets the bit pattern to a hexadecimal value of 00 along with setting the mode of operation to a fast-X mode. This fast-X mode of operation enables writing the bit pattern to each memory cell on a row by row basis in RAM 30 while the column address remains constant. Further, operation 460 transfers execution to the BIST inner loop module 410, discussed in further detail in reference to FIG. 5, along with the aforementioned parameters. After termination of the execution of the BIST inner loop module 410 an error variable 235 is returned to the BIST outer loop module 400. If this error variable 235 is set to one, then the BIST error signal 230 is set high by the RAM BIST state machine 110 and the BIST outer loop module 400 terminates execution.

However, if the error variable returned by the BIST inner loop module 410 is equal to zero then processing proceeds to operation 470. In operation 470, the data bit pattern is set to a hexadecimal value of 55 with a fast-X mode of operations set. Operation 470 further calls upon and executes the BIST inner loop module 410 using the aforementioned parameters. Upon execution of the BIST inner loop module 410, discussed in further detail in reference to FIG. 5, an error variable 235 is returned. If error variable 235 is set to one then the RAM BIST state machine 110 sets the BIST error signal 230 to one and execution of the BIST outer loop module 400 is terminated.

However, if error variable 235 is not equal to one then processing proceeds to operation 480. In operation 480 a data retention module 420, shown in FIG. 3, is executed. The Data retention module 420 is a software module or code segment that writes to memory locations in RAM 30 and then waits a finite period of time, ranging from, for example, but not limited to, 2 to 256 milliseconds, and then executes a read to determine if the memory location retains the value previously set. If the memory location does not retain the value previously set then the error variable 235 is returned set to one. With the error variable 235 set to one, processing of the BIST outer loop module 400 terminates and the BIST error signal 230 is set high. If error variable 235 is not equal to one then processing proceeds to operation 490. In operation 490, the data bit pattern is set to a hexadecimal value of 00 along with a fast-Y mode of operation being set. The fast-Y mode of operation allows for writing to RAM 30 on a column by a column basis while holding the row address constant. In operation 490, the bit pattern and mode of operation are passed to the BIST inner loop module 410. The BIST inner loop module 410 then executes utilizing these parameters and sets error variable 235 to one if an error is detected. If error variable 235 is set to one then the RAM BIST state machine 110 sets BIST error signal 230 high and the BIST outer loop module 400 terminates execution.

However, if upon execution of the BIST inner loop module 410 an error is not discovered and the error variable 235 is not set to one, then processing proceeds to operation 500 in the BIST outer loop module 400. In operation 500, the BIST outer loop module 400 sets a bit pattern to a hexadecimal value of AA and the operation mode to a fast-Y mode. Thereafter, in operation 500 execution is transferred to the BIST inner loop module 410 with the aforementioned parameters for execution. If the BIST inner loop module 410 detects an error then, error variable 235 is set to one. In response to the setting of error variable 235 to one, the RAM BIST state machine 110 will set BIST error signal 230 to high and terminates execution of the BIST outer loop module 400.

However, if upon execution of the BIST inner loop module 410 an error is not found and error variable 235 is not set to one, then processing proceeds to operation 510 in the BIST outer loop module 400. In operation 510, as with operation 480, the data retention module 420 is executed. The data retention module 420 writes to memory locations in RAM 30 and then waits a finite period of time, ranging from, for example, but not limited to, 2 to 256 milliseconds, and then executes a read to determine if the memory location retains the value previously set. If the memory location does not retain the value previously set then error variable 235 is returned set to one. With error variable 235 set to one, processing of BIST outer loop module 400 terminates and the RAM BIST state machine 110 sets the BIST error signal 230 to high. If error variable 235 is not equal to one, then processing proceeds to operation 520. If processing reaches operation 520 all testing related to RAM 30 has successfully completed and no errors have been found in RAM 30.

FIG. 5 is a flowchart of the operations performed by the BIST inner loop module 410. The BIST inner loop module 410 is always executed by a call from the BIST outer loop module 400 from which it receives its required parameters. The BIST inner loop module 410 begins execution in operation 600 and immediately proceeds to operation 610. In operation 610, the bit pattern received from the BIST outer loop module 400 is written to RAM 30 from top to bottom in RAM 30. Processing then proceeds to operation 620 where the bit pattern is read out of RAM 30 and compared to determine if RAM 30 is operating properly. If RAM 30 is not operating properly then error variable 235 is set to one and processing immediately returns to the calling program, which in this case is the BIST outer loop module 400.

If no errors are found in operation 620, then processing proceeds to operation 630. In operation 630 the reverse or not form of the bit pattern is written to RAM 30. For example, if a hexadecimal 55 was written to RAM 30 in operation 610, then in operation 630 a hexadecimal AA is written to RAM 30. Thereafter, in operation 640 a comparison is made between the data written in operation 630 and the data read from RAM 30 in operation 640. If the comparison matches in operation 640, then processing loops back to operation 620 and this continues until all memory in RAM 30 is written to from bottom to top. If an error is discovered in operation 640 then error variable 235 is set to one and the BIST inner loop module 410 terminates execution and returns control to the BIST outer loop module 400.

If no errors are discovered in operation 640, then processing proceeds to operation 650. In operation 650, the not or reverse form of the data is again compared as previously discussed. The purpose of performing back-to-back reads in operations 640 and 650 is done to insure that the data stored in RAM 30 has not changed due to the execution of a read in operation 640. Thereafter, processing proceeds to operation 660 where the bit pattern is written to RAM 30. Then in operation 670, RAM 30 is read and compared against the bit pattern written in operation 660. If the comparison in operation 670 does not match then the error variable 235 is set to one and processing terminates for the BIST inner loop module 410 and returns control to the BIST outer loop module 400.

However, if no error is detected in operation 670 then processing proceeds to operation 680 where again the bit pattern is read from RAM 30 and a comparison is made as previously discussed. These successive reads in operations 670 and 680 are done to ensure that the read operation in 670 has not caused a change to occur in the data stored in RAM 30. If the comparison is not found to match in operation 680, then the error variable 235 is set to one, processing ceases for the BIST inner loop module 410 and control returns to the BIST outer loop module 400. However, in operation 690, if no errors are detected in operation 680, then the inverse or not form of the bit pattern is written to RAM 30. Thereafter, in operation 700, a read to RAM 30 is executed and a comparison is made as previously discussed. If the comparison does not match then error variable 235 is set to one, the BIST inner loop module 410 ceases execution, and processing returns to the BIST outer loop module 400.

However, if no error is discovered in operation 700, then processing proceeds to operation 710 where another read and comparison operation occurs on the not or reverse form of the bit pattern written to RAM 30. This is done in order to insure that the prior read to RAM 30 has not caused any change in the data stored in RAM 30 to occur. If an error is detected in operation 710, error variable 235 is set to one and processing of the BIST internal loop module 410 terminates and transfers control to the BIST outer loop module 400. However, if no error is detected in operation 710, then processing proceeds to operation 720 where the bit pattern is written to RAM 30. In operation 730, again another read and compare operation is executed and if an error is detected then error variable 235 is set to one and processing for the BIST inner loop module 410 terminates and transfers control to the BIST outer loop module 400.

However, if no errors are detected in operation 730 then processing proceeds to operation 740 where the BIST inner loop module 410 terminates execution and returns control to the BIST outer loop module 400. If processing has reached operation 740, then the RAM 30 memory tests by the BIST inner loop module 410 has completed successfully.

The benefits resulting from the present invention are that memory embedded in a single chip which is not directly accessible from outside the chip may be tested in a production environment at the full operating speed. This is accomplished with minimal impact to the hardware design of the chip. Further, minimal space for additional logic required by the present invention on the chip is used. In addition, the logic and hardware added to the chip in the embodiments of the present invention does not impact the timing and execution of the normal operation of the chip. Therefore, chips designed to communicate to other devices or interface to peripheral devices may have their onboard embedded memory tested and assured that it is operating correctly.

While we have shown and described only a few examples herein, it is understood that numerous changes and modifications as known to those skilled in the art could be made in the embodiments of the present invention. Therefore, we do not wish to be limited to the details shown and described herein, but intend to coverall such changes and modifications as are encompassed by the scope of the appended claims.

We claim:

1. A device to test memory embedded in a chip, comprising:
   a state machine embedded in the chip to execute a plurality of successive reads for each individual memory location within the memory to test for read disturbance faults in the memory embedded on the chip;
   a row and column address generator connected to the state machine to access each memory location in the memory embedded in the chip;
   a data generator to generate and write data to memory locations specified by the row and column address generator in the memory embedded in the chip;
   a plurality of multiplexers to accept data from the data generator and pass the data to the memory embedded in the chip; and
   a data comparator connected to the state machine to compare the data received from the data generator and the data received from the memory embedded on the chip, wherein when a match is not detected by the data comparator, the state machine sets an error signal indicating a memory failure.

2. The device as recited in claim 1, wherein control circuitry of the chip uses the memory embedded in the chip as a temporary storage location and will not enable the state machine to test unless a predetermined test mode indication is applied to the chip.

3. The device as recited in claim 1, wherein the plurality of multiplexers will receive and pass data received from control circuitry when a signal from the state machine is indicative of a normal mode, and will not pass data from the control circuitry when the signal from the state machine is indicative of a test mode.

4. The device as recited in claim 3, wherein the plurality of multiplexers will receive and pass data received from the data generator when the signal from the state machine is indicative of the test mode.

5. The device as recited in claim 1, wherein the state machine is to execute:
   a BIST outer loop to set a bit pattern and to set a mode of operation to be used in testing the memory embedded on the chip;
   a BIST inner loop to write the bit pattern to the memory embedded on the chip using the data generator and to compare the data read from the memory embedded on the chip with the bit pattern written to the memory; and
   a data retention test to write the bit pattern to the memory embedded in the chip, wait a programmed finite period of time, and read the bit pattern from the memory embedded in the chip to determine if a stored bit pattern has changed over time.

6. The device as recited in claim 1, where the state machine is to execute a plurality of successive reads of each memory location by testing in both top-to-bottom and bottom-to-top memory address directions, so as to test for read disturbance faults in the memory embedded on the chip.

7. The device as recited in claim 1, where the device is embedded as part of a communications controller chip.

8. A method of testing memory embedded on a chip, comprising:
   executing, using a state machine embedded in the chip, a plurality of successive reads for each individual memory location within the memory to test for read disturbance faults in the memory embedded on the chip;
   accessing, using a row and column address generator connected to the state machine, each memory location in the memory embedded in the chip;
   using a data generator to generate and write data to memory locations specified by the row and column address generator in the memory embedded in the chip;
   controlling a plurality of multiplexers to accept data from the data generator and pass the data to the memory embedded in the chip; and
   comparing the data received from the data generator and the data received from the memory embedded on the chip, wherein when a match is not detected by the data comparator, the state machine setting an error signal indicating a memory failure,
   compare the data received from the data generator and the data received from the memory embedded on the chip, wherein when a match is not detected by the data comparator, the state machine setting an error signal indicating a memory failure.

9. The method as recited in claim 8, comprising control circuitry of the chip using the memory embedded in the chip as a temporary storage location, and not enabling the state machine to test unless a predetermined test mode indication is applied to the chip.

10. The method as recited in claim 8, comprising controlling the plurality of multiplexers to receive and pass data received from control circuitry when a signal from the state machine is indicative of a normal mode, and controlling the plurality of multiplexers so as to not pass data from the control circuitry when the signal from the state machine is indicative of a test mode.

11. The method as recited in claim 10, comprising controlling the plurality of multiplexers so as to receive and pass data received from the data generator when the signal from the state machine is indicative of the test mode.

12. The method as recited in claim 8, comprising:
   using a BIST outer loop module to set a bit pattern and to set a mode of operation to be used in testing the memory embedded on the chip;
   using a BIST inner loop module to write the bit pattern to the memory embedded on the chip using the data generator and to compare the data read from the memory embedded on the chip with the bit pattern written to the memory; and
   using a data retention test module to write the bit pattern to the memory embedded in the chip, wait a programmed finite period of time, and read the bit pattern from the memory embedded in the chip to determine if a stored bit pattern has changed over time.

13. The method as recited in claim 8, comprising using the state machine is to execute the plurality of reads of the memory locations by testing in both top-to-bottom and bottom-to-top memory address directions, so as to test for read disturbance faults in the memory embedded on the chip.

14. The method as recited in claim 8, where the method is embedded in and effected as part of a communications controller chip.

15. A machine-readable medium containing at least one sequence of on-chip memory test instructions that, when executed, causes a machine to:
   execute, using a state machine embedded in a chip, a plurality of successive reads for each individual memory location to test for read disturbance faults in the memory embedded on the chip;
   access, using a row and column address generator connected to the state machine, each memory location in the memory embedded in the chip;
   generate and write, using a data generator, data to memory locations specified by the row and column address generator in the memory embedded in the chip;
   control a plurality of multiplexers to accept data from the data generator and pass the data to the memory embedded in the chip; and
   compare the data received from the data generator and the data received from the memory embedded on the chip, wherein when a match is not detected by the data comparator, the state machine setting an error signal indicting a memory failure.

16. The medium as recited in claim 15, the at least one sequence of on-chip memory test instructions, when executed, causes the machine to:
   allow control circuitry of the chip to use the memory embedded in the chip as a temporary storage location, and not enable the state machine to test unless a predetermined test mode indication is applied to the chip.

17. The medium as recited in claim 15, the at least one sequence of on-chip memory test instructions, when executed, causes the machine to:
   control the plurality of multiplexers to receive and pass data received from control circuitry when a signal from the state machine is indicative of a normal mode, and control the plurality of multiplexers to not pass data from the control circuitry when the signal from the state machine is indicative of a test mode.

18. The medium as recited in claim 17, the at least one sequence of on-chip memory test instructions, when executed, causes the machine to:
   control the plurality of multiplexers to receive and pass data received from the data generator when the signal from the state machine is indicative of the test mode.

19. The medium as recited in claim 15, the at least one sequence of on-chip memory test instructions, when executed, causes the machine to:
   use a BIST outer loop module to set a bit pattern and to set a mode of operation to be used in testing the memory embedded on the chip;
   use a BIST inner loop module to write the bit pattern to the memory embedded on the chip using the data generator and to compare the data read from the memory embedded on the chip with the bit pattern written to the memory; and
   use a data retention test module to write the bit pattern to the memory embedded in the chip, wait a programmed finite period of time, and read the bit pattern from the memory embedded in the chip to determine if a stored bit pattern has changed over time.

20. The medium as recited in claim 15, the at least one sequence of on-chip memory test instructions, when executed, causes the machine to:
   use the state machine to execute a plurality of successive reads of each memory location by testing in both top-to-bottom and bottom-to-top memory address directions, to test for read disturbance faults in the memory embedded on the chip.

21. The medium as recited in claim 15, where the medium is embedded in and effected as part of a communications controller chip.

* * * * *